United States Patent
Takagi

(10) Patent No.: US 7,535,230 B2
(45) Date of Patent: May 19, 2009

(54) MAGNETIC RESONANCE IMAGING APPARATUS AND MAGNETIC RESONANCE IMAGING METHOD

(75) Inventor: Mitsuo Takagi, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 12/042,504

(22) Filed: Mar. 5, 2008

(65) Prior Publication Data

US 2008/0218168 A1 Sep. 11, 2008

(30) Foreign Application Priority Data

Mar. 8, 2007 (JP) ............................. 2007-058901
Feb. 14, 2008 (JP) ............................. 2008-033422

(51) Int. Cl.
*G01V 3/00* (2006.01)
(52) U.S. Cl. ........................................ 324/318; 324/322
(58) Field of Classification Search ......... 324/300–322; 600/407–422; 333/101–103; 340/825.79; 128/623.5, 899
See application file for complete search history.

(56) References Cited

U.S. PATENT DOCUMENTS

| | | | | |
|---|---|---|---|---|
| 5,066,914 A * | 11/1991 | Vavrek et al. | ................ | 324/309 |
| 5,754,118 A * | 5/1998 | Brunner | ...................... | 340/2.23 |
| 5,932,936 A * | 8/1999 | Potthast et al. | .............. | 307/113 |
| 6,223,065 B1 * | 4/2001 | Misic et al. | .................. | 600/410 |
| 6,323,656 B2 * | 11/2001 | Shoemaker | .................. | 324/537 |
| 6,452,374 B1 * | 9/2002 | Kreischer | .................. | 324/73.1 |
| 6,608,480 B1 * | 8/2003 | Weyers | ........................ | 324/318 |
| 7,026,818 B2 * | 4/2006 | Machida et al. | ............. | 324/322 |
| 7,176,689 B2 * | 2/2007 | Machida et al. | ............. | 324/318 |
| 7,372,345 B2 * | 5/2008 | Kess | .......................... | 333/103 |
| 7,400,148 B2 * | 7/2008 | Adachi | ........................ | 324/322 |
| 7,408,349 B1 * | 8/2008 | Hertz | .......................... | 324/318 |
| 2006/0214662 A1 | 9/2006 | Adachi | | |
| 2008/0246477 A1 * | 10/2008 | Nakabayashi | ............... | 324/312 |

FOREIGN PATENT DOCUMENTS

JP 2001-046356 2/2001

* cited by examiner

*Primary Examiner*—Brij B Shrivastav
(74) *Attorney, Agent, or Firm*—Nixon & Vanderhye PC

(57) ABSTRACT

A magnetic resonance imaging apparatus includes a applying unit which applies a gradient magnetic field and a radio-frequency pulse to a subject placed in a static magnetic field, a radio-frequency coil unit which includes element coils to respectively detect magnetic resonance signals emitted from the subject, and outputs signals of a plurality of channels based on the magnetic resonance signals, receiving circuits each of which receives one of the signals of the plurality of channels, and whose number is smaller than the channels, a selecting circuit which includes matrix switches connected in multiple stages, selects some of magnetic resonance signals from the signals of the channels, and inputs the selected magnetic resonance signals to the receiving circuits, a setting unit which sets diagnostic conditions, and a determining unit which determines a connection state of the matrix switches in accordance with the set diagnostic conditions.

9 Claims, 14 Drawing Sheets

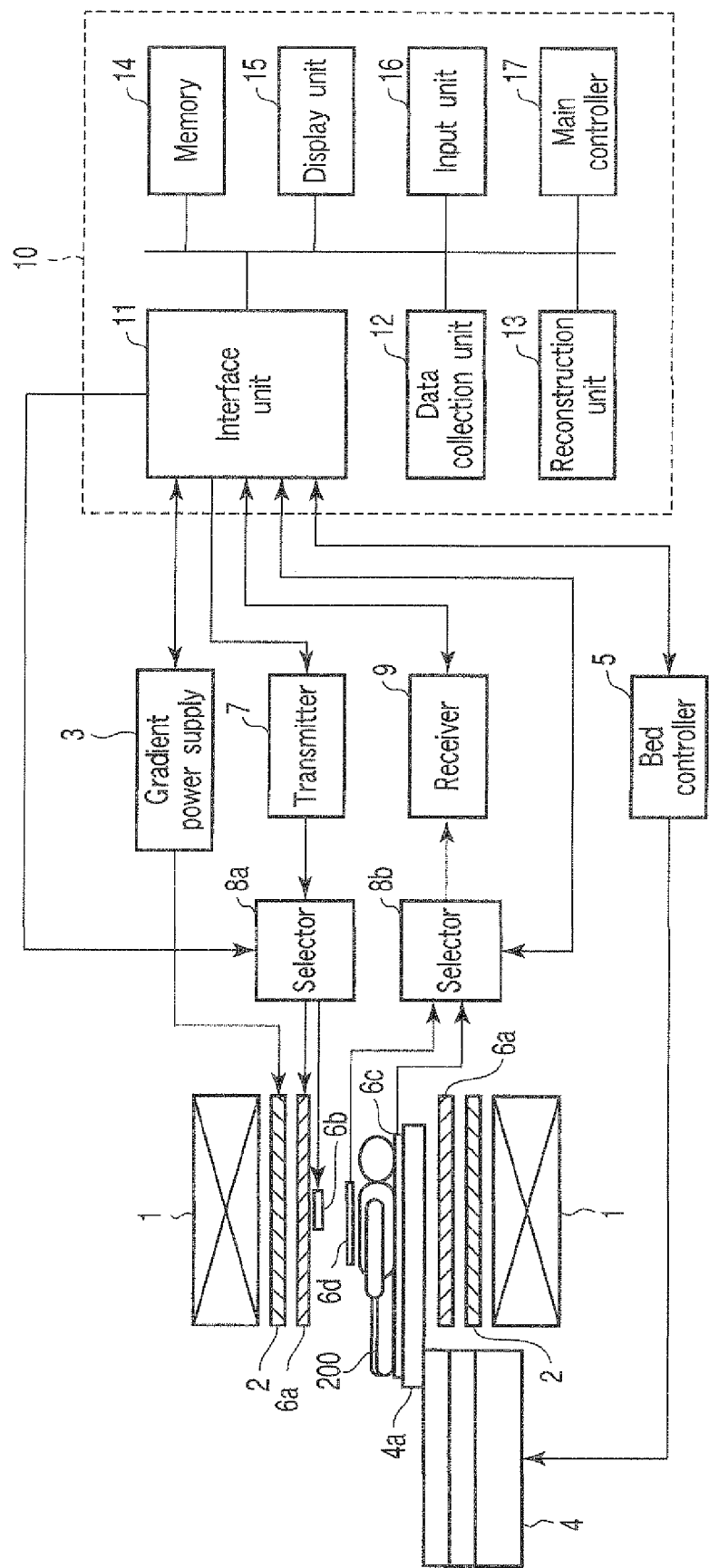
F I G. 1

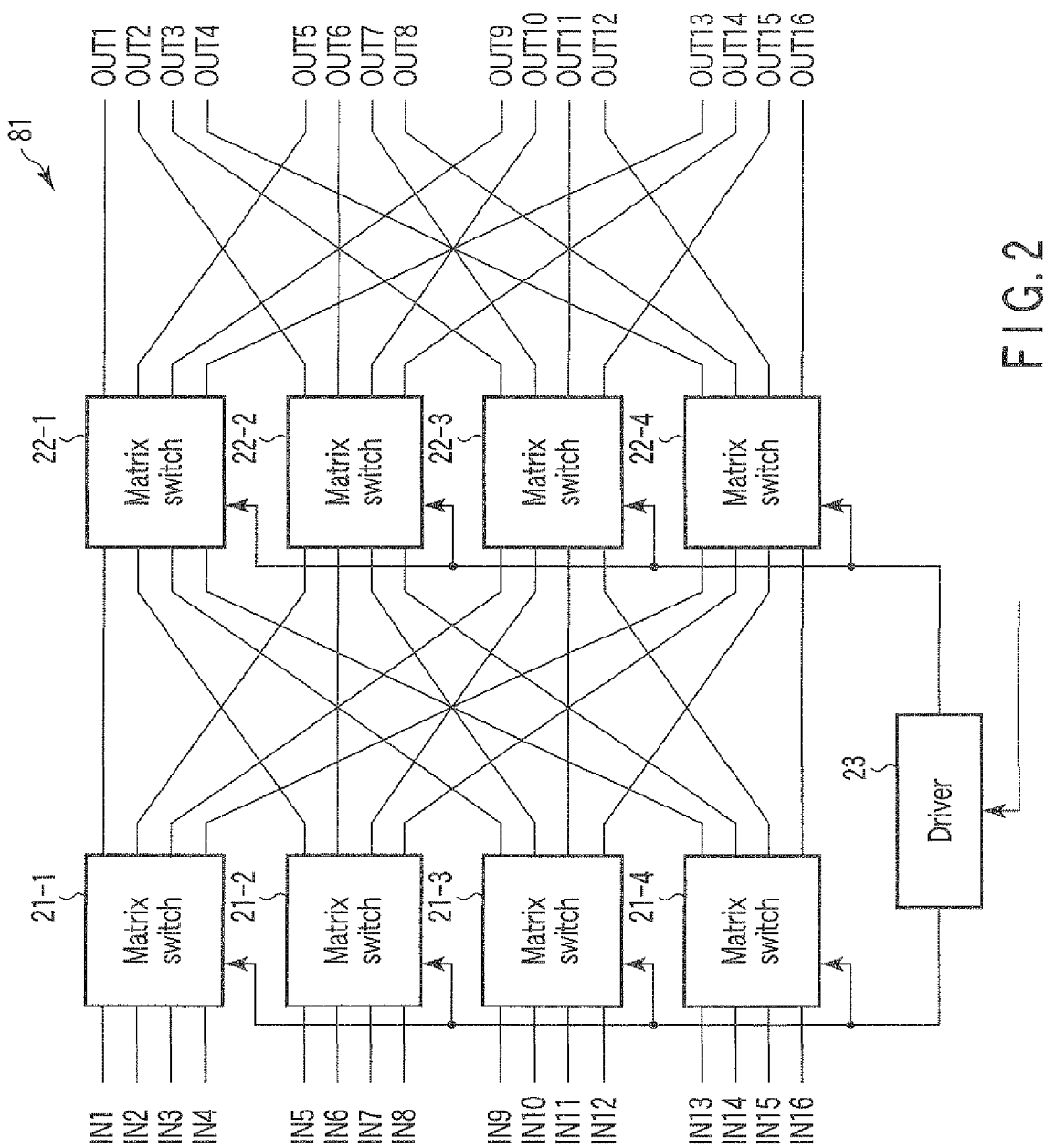
F I G. 2

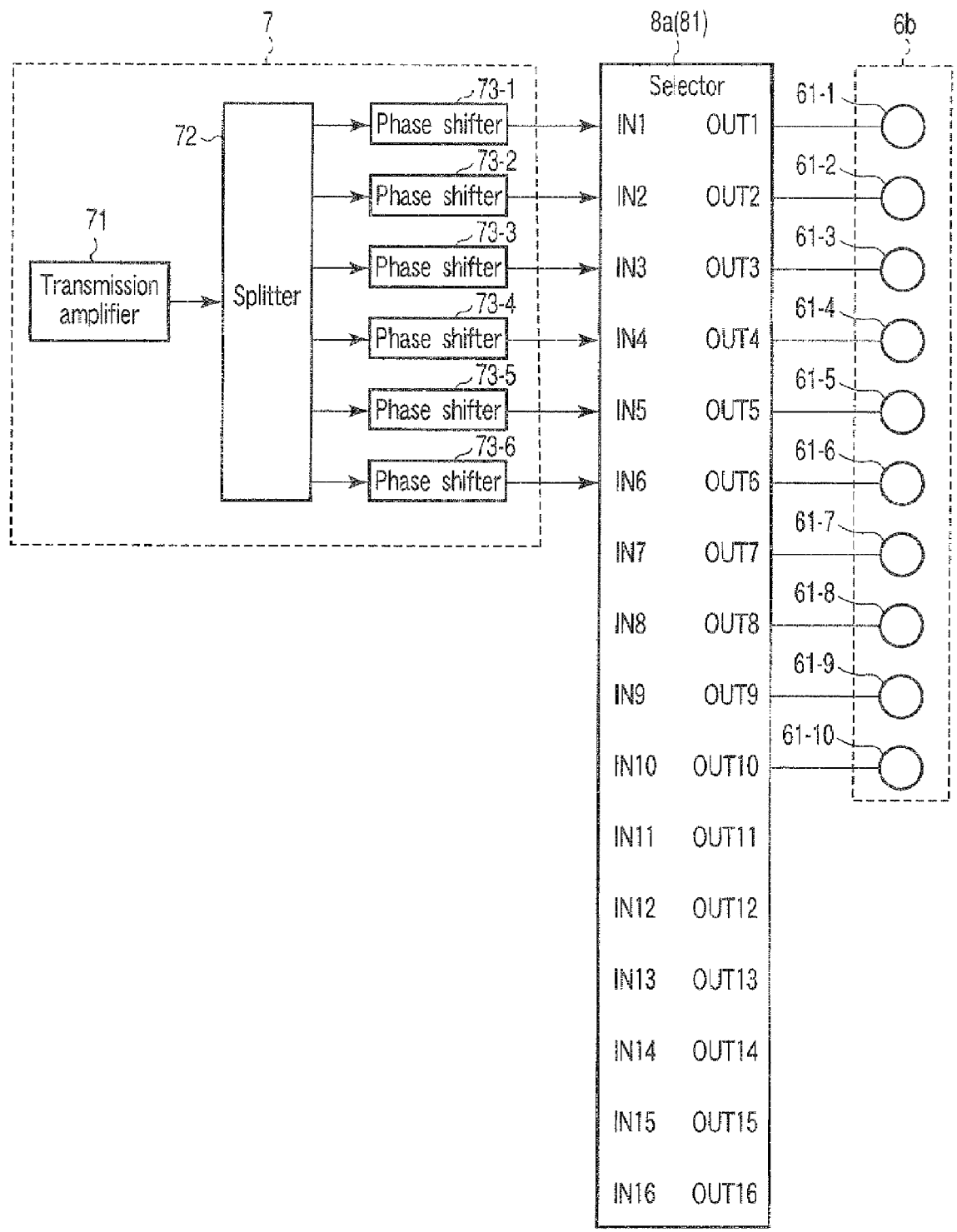
F I G. 3

| Sections utilized | Section priorities | | | |
|---|---|---|---|---|
| | 1 | 2 | 3 | 4 |
| 63-1, 63-2 | 63-1 | 63-2 | - | - |
| 63-2, 63-3 | 63-2 | 63-3 | - | - |
| 63-3, 63-4 | 63-3 | 63-4 | - | - |
| 63-1, 63-2, 63-3 | 63-2 | 63-1 | 63-3 | - |
| 63-2, 63-3, 63-4 | 63-3 | 63-2 | 63-4 | - |
| 63-1, 63-2, 63-3, 63-4 | 63-2 | 63-3 | 63-1 | 63-4 |

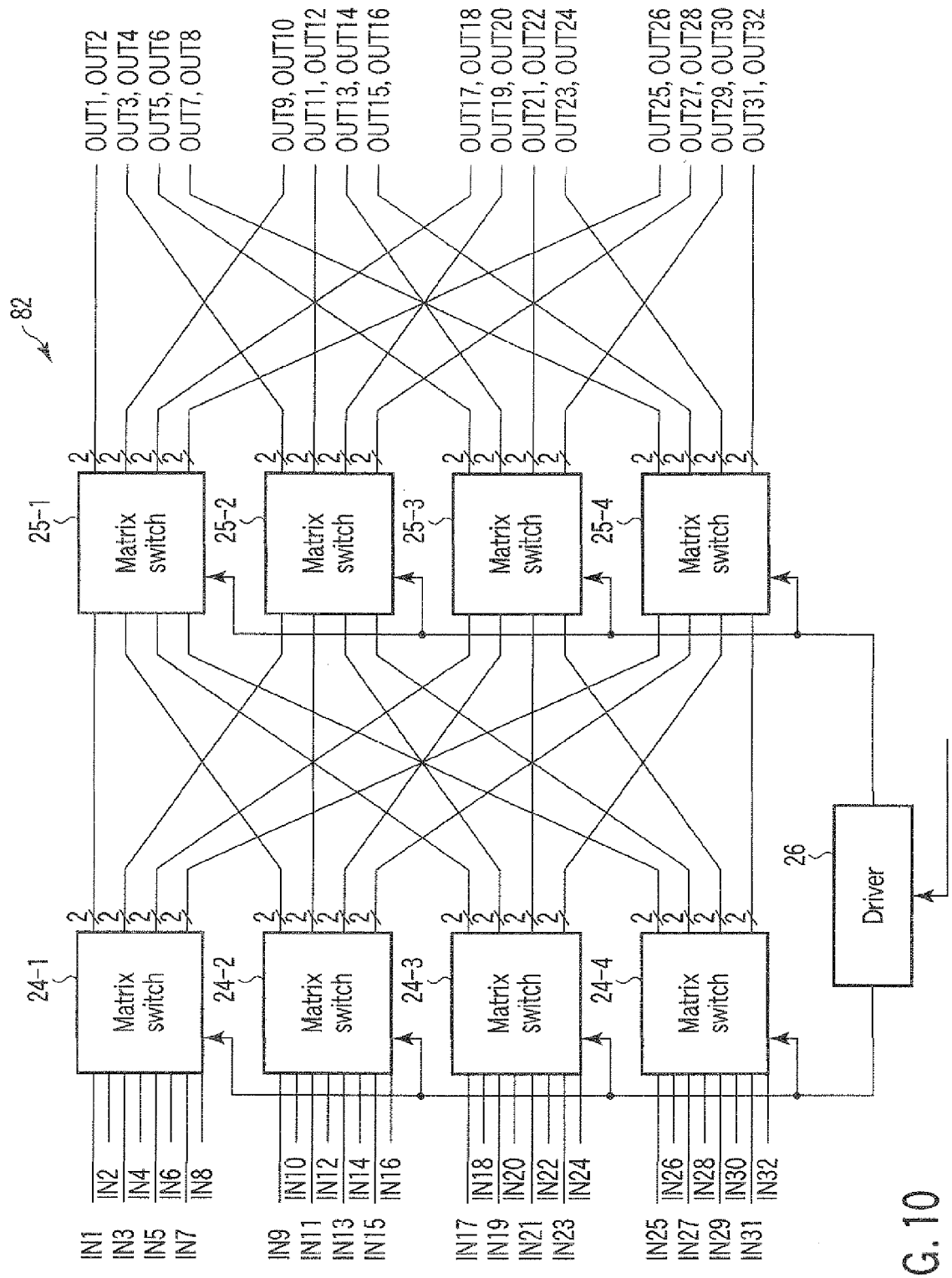
F I G. 10

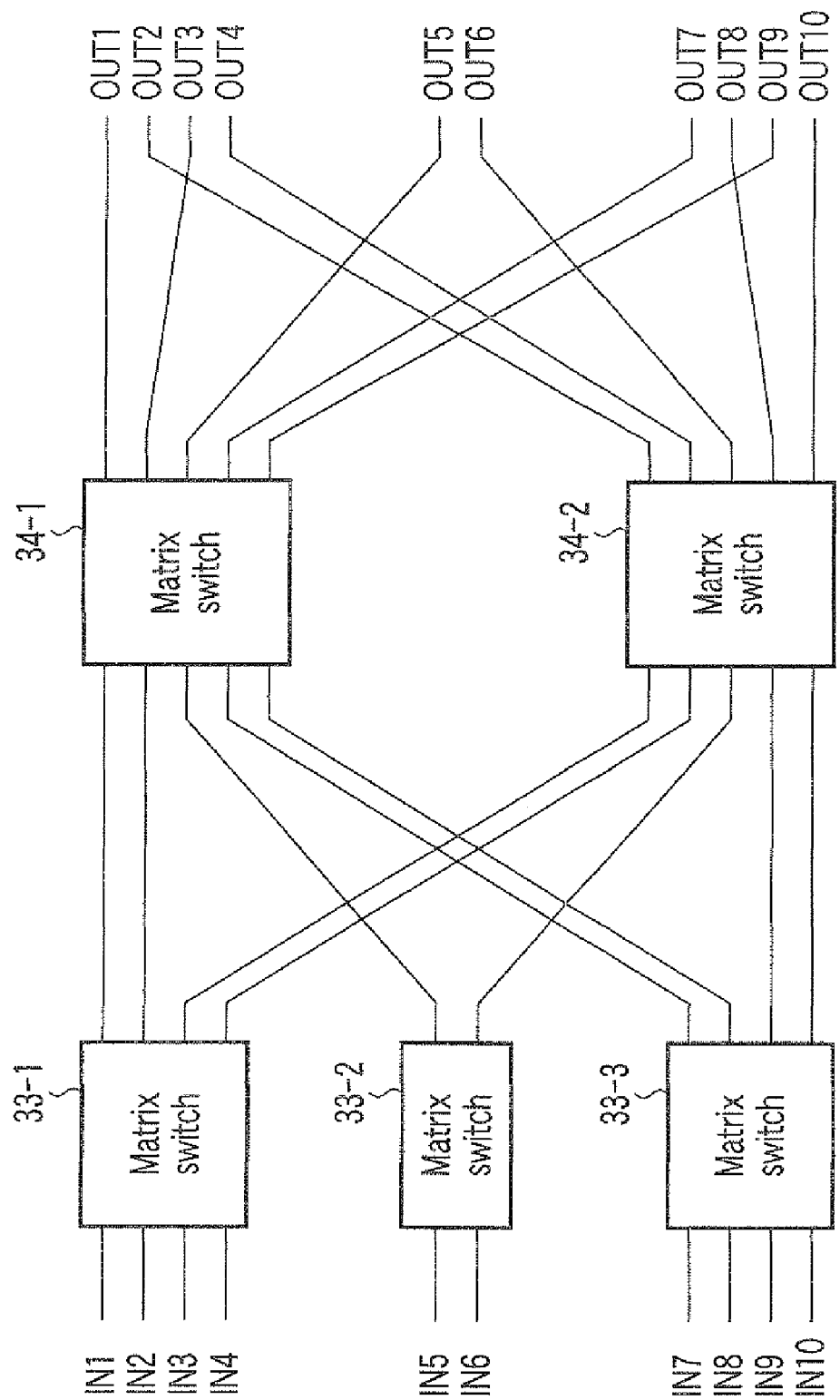
F I G. 13

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from prior Japanese Patent Applications No. 2007-058901, filed Mar. 8, 2007; and No. 2008-033422, filed Feb. 14, 2008, the entire contents of both of which are incorporated herein by reference.

BACKGROUND OF THE INVENTION

1. Field of the Invention

The present invention relates to a magnetic resonance imaging apparatus and magnetic resonance imaging method that uses a plurality of element coils to transmit an RF (radio frequency) pulse or receive a magnetic resonance signal.

2. Description of the Related Art

A magnetic resonance imaging apparatus in recent years can utilize various kinds of radio-frequency coils meeting the purposes. As such radio-frequency coils, there is one in which a plurality of element coils are arranged. Further, a plurality of types of radio-frequency coils may be simultaneously disposed in some cases.

Thus, in the magnetic resonance imaging apparatus, a plurality of element coils arranged in a radio-frequency coil or a plurality of types of radio-frequency coils can be connected in parallel, and the number of these coils is increasing.

On the other hand, all element coils connected in parallel in this manner are not simultaneously used. Therefore, the number of receiving circuits that receive magnetic resonance signals through element coils or the number of transmitting circuits that transmit RF pulses is smaller than the number of connectable element coils.

In such a case, element coils which should be used must be selectively connected with the receiving circuit or the transmitting circuit. However, the number of combinations of connection states is large, and hence a selecting circuit becomes very complicated. As the selecting circuit, a transfer type switch or a matrix switch is typically applied.

FIG. 14 is a view showing a structural example of a transfer type switch. In this example, four two-input/one-output selectors 141, 142, 143, and 144 constitute a four-input/two-output signal selecting circuit.

FIG. 15 is a view showing a structure of a 16-input/16-output matrix switch.

In the transfer type switch, a degree of flexibility in selection is small, and realization of multichannel is difficult.

In the matrix switch, a degree of flexibility in selection is higher than that in the transfer type, and realization of multichannel is relatively easy. However, in a multichannel type matrix switch, such an unconnected line called a stab as shown in FIG. 15 becomes long depending on a signal selection state. In case of a radio-frequency signal like a magnetic resonance signal, the signal may be degraded when a stab becomes long. Further, when the stab is long at the time of selecting an RF transmission signal, unnecessary radiation may be disadvantageously increased.

It is to be noted that, as a related technology, a technology disclosed in, e.g., JP-A 2001-46356 (KOKAI) is known.

BRIEF SUMMARY OF THE INVENTION

Under the circumstances, there has been demanded freely enabling multichannel signal selection while shortening a stab as much as possible to suppress degradation in a radio-frequency signal or unnecessary radiation.

According to a first aspect of the present invention, there is provided a magnetic resonance imaging apparatus comprising: applying unit which applies a gradient magnetic field and a radio-frequency pulse to a subject placed in a static magnetic field; a radio-frequency coil unit which includes a plurality of element coils to respectively detect magnetic resonance signals emitted from the subject in accordance with the application of the gradient magnetic field and the radio-frequency pulse, and outputs signals of a plurality of channels based on the plurality of magnetic resonance signals detected by the plurality of element coils; a plurality of receiving circuits each of which receives one of the signals of the plurality of channels, and whose number is smaller than the plurality of channels; a selecting circuit which includes a plurality of matrix switches connected in multiple stages, selects some of magnetic resonance signals from the signals of the plurality of channels, and inputs the selected magnetic resonance signals to the plurality of receiving circuits; a setting unit which sets diagnostic conditions; and a determining unit which determines a connection state of the plurality of matrix switches in accordance with the set diagnostic conditions.

According to a second aspect of the present invention, there is provided a magnetic resonance imaging apparatus comprising: a transmission coil having a plurality of element coils; transmitting circuits which transmit a radio-frequency pulse applied to a subject placed in a static magnetic field through the element coils, and whose number is smaller than the plurality of element coils; a selecting circuit which includes a plurality of matrix switches connected in multiple stages, selects some of the plurality of element coils, and connects the selected element coils with the plurality of transmitters; a determining unit determines a connection state of the plurality of matrix switches in accordance with a size of the subject; and a receiving coil which detects an electromagnetic field emitted from the subject in accordance with the application of a radio-frequency magnetic field produced form the element coils in a state where a gradient magnetic field is applied in accordance with the radio-frequency pulse input based on the connection state.

According to a third aspect of the present invention, there is provided a magnetic resonance method for use in a magnetic resonance imaging apparatus comprising: a high-frequency coil unit including a plurality of element coils; and selecting circuit which includes a plurality of matrix switches connected in multiple stages, the method comprising: setting an imaging condition; determining a connection state of the matrix switches in accordance with the set imaging condition; applying a gradient magnetic field and a radio-frequency pulse to a subject placed in a static magnetic field; detecting magnetic resonance signals emitted from the subject in accordance with the application of the gradient magnetic field and the radio-frequency pulse, at each of the element coils; acquiring signals of a plurality of channels based on the magnetic resonance signals detected by the element coils; selecting part of the signals of the plurality of channels by means of the selecting circuit whose connection state of the matrix switches is the determined connection state; and receiving and processing signals selected by the selecting circuit.

According to a fourth aspect of the present invention, there is provided a magnetic resonance imaging method for use in a magnetic resonance imaging apparatus comprising: a transmission coil having a plurality of element coils; and a selection circuit including a plurality of matrix switches connected in multiple stages, the method comprising: determining a connection state of the matrix switches in accordance with size of a subject; selecting part of the element coils by means of the selecting circuit whose connection state of the matrix switches is the determined connection state; transmitting radio-frequency pulses to be applied to the subject placed in a static magnetic field through the element coils, by supplying selected ones of the element coils with radio-frequency pulses which are smaller in number than the element coils; and detecting an electromagnetic field emitted from the subject in accordance with the application of a radio-frequency magnetic field produced form the selected ones of the element coils in a state where a gradient magnetic field is applied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a view showing a structure of a magnetic resonance imaging apparatus according to an embodiment of the present invention;

FIG. 2 is a view showing a structure of a signal selecting circuit according to a first embodiment which can be utilized as selectors depicted in FIG. 1;

FIG. 3 is a view showing an example of a connection state of an RF coil unit and a transmitter to the selector in FIG. 1;

FIG. 10 is a view showing a structure of a signal selecting circuit according to a second embodiment which can be utilized as the selectors in FIG. 1;

FIG. 13 is a view showing a structural example of a modification of the present invention;

DETAILED DESCRIPTION OF THE INVENTION

Figure 4:
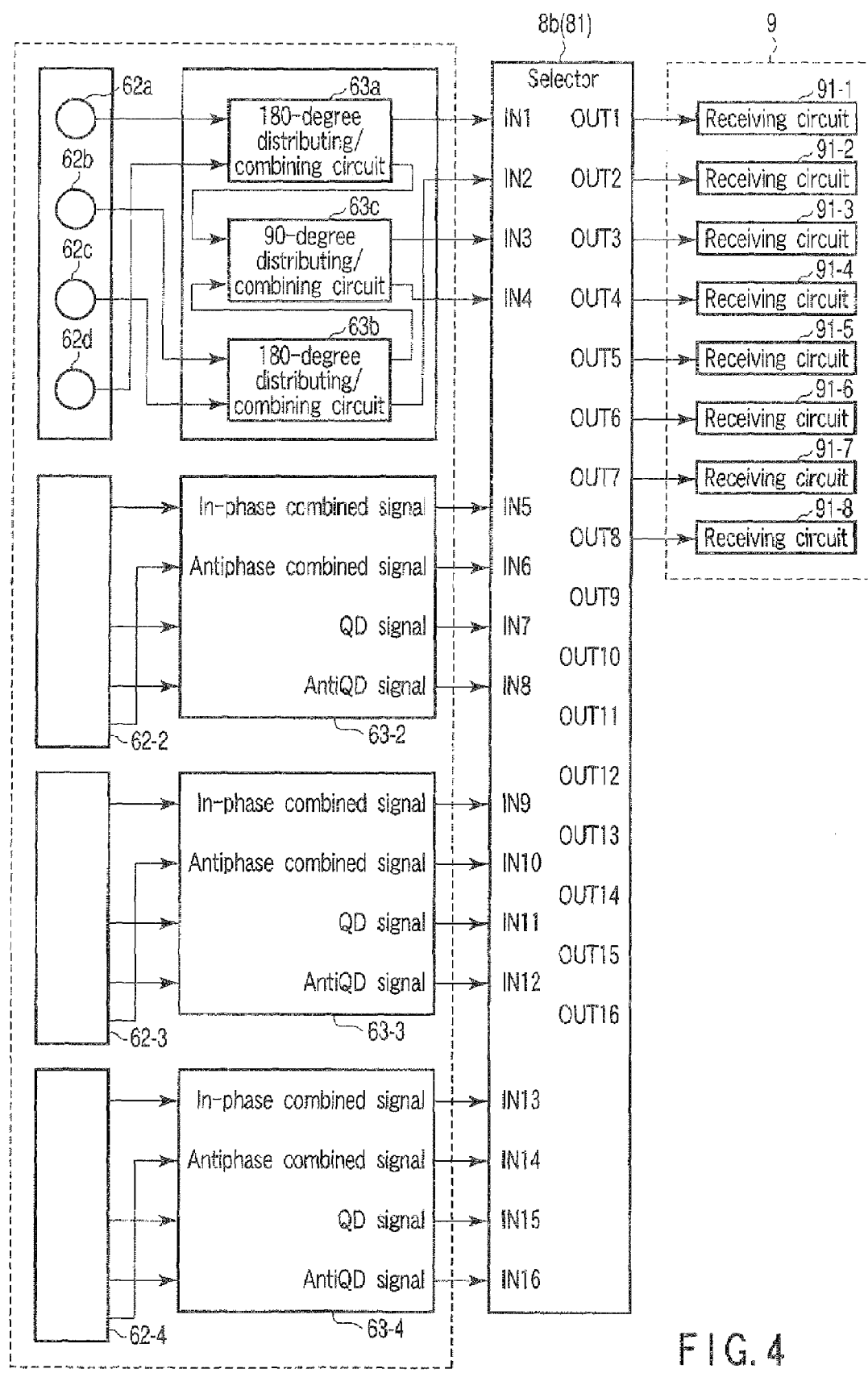
FIG. 4 is a view showing an example of a connection state of an RF coil unit and a receiver to the selector in FIG. 1.

Hereinafter, embodiments according to the present invention will be described with reference to drawings.

FIG. 1 is a diagram illustrating a configuration of a magnetic resonance imaging apparatus 100 related to the present embodiment. The magnetic resonance imaging apparatus 100 shown in FIG. 1 comprises a static field magnet 1, a gradient coil unit 2, a gradient power supply 3, a bed 4, a bed controller 5, RE coil units 6a, 6b, 6c and 6d, a transmitter 7, a selector 8b, a receiver 9 and a computer system 10.

The static field magnet 1 is a hollow cylindrical member, which generates a uniform static magnetic field inside the hollow space. For instance, a permanent magnet or a superconducting magnet is used as the static field magnet 1.

The gradient coil unit 2 is also a hollow cylindrical member located inside the static field magnet 1. The gradient coil unit 2 is formed by a combination or three coils corresponding to three axes X, Y and Z which are perpendicular to each other. In the gradient coil unit 2, the three coils are individually supplied with a current from the gradient power supply 3, thereby generating gradient magnetic fields having their magnetic field intensities varied along the X, Y and Z axes. Assume here that the Z-axis corresponds to, for example, the magnetization direction of the static magnetic field. The gradient magnetic fields along the X, Y and Z axes correspond to, for example, a slice-selecting gradient magnetic field Gs, a phase-encoding gradient magnetic field Ge and a readout gradient magnetic field Gr, respectively. The slice-selecting gradient magnetic field Gs is used to determine an arbitrary imaging section. The phase-encoding gradient magnetic field Ge is used to change the phase of a magnetic resonance signal in accordance with its spatial position. The readout gradient magnetic field Gr is used to change the frequency of a magnetic resonance signal in accordance with its spatial position.

A subject 200 placed on a top board 4a of the bed 4 is inserted into the cavity (imaging space) of the gradient coil unit 2. The bed 4 is driven by the bed controller 5 to move the top board 4a longitudinally (horizontally in FIG. 1) and vertically. Normally, the bed 4 is positioned, with its longitudinal axis being set parallel to the central axis of the static field magnet 1.

The RF coil unit 6a is made by arranging one or a plurality of element coils in a cylindrical case. The RF coil unit 6a is located inside the gradient coil unit 2, and is used to generate a radio-frequency magnetic field upon receiving a radio-frequency pulse (an RF pulse) from the transmitter 7.

The RF coil units 6b, 6c and 6d are mounted on the top board 4a, built in the top board 4a, or attached to the subject 200. When imaging is performed, the RF coil units 6b, 6c and 6d are inserted together with the subject 200 into the imaging space of the gradient coil unit 2. Array coils are used as the RF coil units 6b, 6c and 6d. In other words, each of the RF coil units 6b, 6c and 6d includes a plurality of element coils. Each of the element coils included in the RF coil unit 6b receives an RE pulse from a transmitter 7 to generate a radio-frequency magnetic field. Each of the element coils included in the RF coil units 6c and 6d receives magnetic resonance signals emitting from the subject 200. Output signals from the element coils are input to the selector 8b, individually. The RF coil units for signal transmission or signal reception are not limited to the RF coil units 6b, 6c and 6d, and various types of RF coil units may be arbitrarily attached. In addition, one or three or more of the RF coil units for signal transmission or signal reception may be attached thereto.

The transmitter 7 outputs an RF pulse corresponding to the Larmor frequency. Furthermore, The transmitter 7 can output in parallel the plurality of RE pulses having different phases thereto, respectively.

A selector 8a arbitrarily supplies one RF pulse or the plurality of RF pulses output from the transmitter 7 to the plurality of element coils included in the RF coil unit 6a or 6b. It is indicated by the computer system 10 that a certain RF pulse is supplied to a certain element coil.

The selector 8b selects some signals from a plurality of magnetic resonance signals output from the RF coil units 6c and 6d. The selector 8b supplies the selected magnetic resonance signals to the receiver 9. The computer system 10 designates which channel to select.

The receiver 9 includes processing systems corresponding to a plurality of channels, and each processing system includes a preamplifier, a phase detection unit and an analog-to-digital converter. Magnetic resonance signals selected by the selector 8b are input to these plural-channel processing systems, respectively. The preamplifier amplifies magnetic resonance signals. The phase detection unit detects the phase of the magnetic resonance signals output from the preamplifier. The analog-to-digital converter digitizes the signals output from the phase detection unit. The receiver 9 outputs digital signals produced from each processing system.

The computer system 10 includes an interface 11, a data collection unit 12, a reconstruction unit 13, a memory 14, a display unit 15, an input unit 16 and a main controller 17.

The interface 11 is connected to the gradient power supply 3, bed controller 5, transmitter 7, receiver 9, selecting circuit 8, etc. The interface 11 permits signals to be interfaced between each of these connected units and the computer system 10.

The data collection unit 12 collects digital signals output from the receiver 9. The data collection unit 12 stores the collected digital signals, i.e., magnetic resonance signal data, in the memory 14.

The reconstruction unit 13 performs post-processing such as Fourier transform on the magnetic resonance signal data stored in the memory 14, thereby acquiring spectrum data or image data corresponding to a desired nuclear spin in the subject 200.

The memory 14 stores the magnetic resonance signal data and spectrum data or image data of each subject.

The display unit 15 displays various information items, such as spectrum data or image data, etc., under the control of the controller 17. The display unit 15 may be a liquid crystal display, for example.

The input unit 16 receives various instructions or information items input by an operator. The input unit 16 may be a pointing device, such as a mouse or a track ball, a selective device, such as a mode switch, or an input device, such as a keyboard.

The main controller 17 includes a CPU, a memory, etc., and controls the entire magnetic resonance imaging apparatus 100 of the present embodiment.

FIRST EMBODIMENT

FIG. 2 is a view showing a structure of a signal selecting circuit 8a according to a first embodiment which can be utilized as a selector 8a or a selector 8b. Both a maximum number of input signals and a maximum number of output signals of this signal selecting circuit 81 are "16".

The signal selecting circuit 81 includes matrix switches 21-1 to 21-4, matrix switches 22-1 to 22-4, and a driver 23.

All of the matrix switches 21-1 to 21-4 and the matrix switches 22-1 to 22-4 are matrix switches having a known four-input/four-output (4×4) structure.

Signals respectively output from element coils provided in the RF coil units 6c and 6d are input to a total of 16 input terminals provided to the matrix switches 21-1 to 21-4. It is to be noted that signals input to the matrix switch 21-1 are referred to as input signals IN1 to IN4, signals input to the matrix switch 21-2 are referred to as input signals IN5 to IN8, signals input to the matrix switch 21-3 are referred to as input signals IN9 to IN12, and signals input to the matrix switch 21-4 are referred to as input signals IN13 to IN16 in this example.

Four output terminals of each of the matrix switches 21-1 to 21-4 are connected with input terminals provided to each of the matrix switches 22-1 to 22-4, respectively. Signals output from first output terminals provided to the matrix switches 22-1 to 22-4 are output from the signal selecting circuit 81 as output signals OUT1 to OUT4, respectively. Signals output from second output terminals provided to the matrix switches 22-1 to 22-4 are output from the signal selecting circuit 81 as output signals OUT5 to OUT8, respectively. Signals output from third output terminals provided to the matrix switches 22-1 to 22-4 are output from the signal selecting circuit 81 as output signals OUT9 to OUT12, respectively. Signals output from fourth output terminals provided to the matrix switches 22-1 to 22-4 are output from the signal selecting circuit 81 as output signals OUT13 to OUT16, respectively.

The driver 23 receives a command from a main controller 17 through an interface unit 11. The driver 23 drives the matrix switches 21-1 to 21-4 and the matrix switches 22-1 to 22-4 so that appropriate signal selection can be carried out in accordance with this command.

When applying the thus configured signal selecting circuit 81 to the selector 8b, up to 16 element coils can be connected with the total of 16 input terminals provided to the matrix switches 21-1 to 21-4, respectively. It is to be noted that, when the number of the element coils is 15 or below, the input terminals to which these element coils are to be connected can be arbitrarily selected.

On the other hand, a plurality of channel processing systems of a receiver 9 are connected with the output terminals of the matrix switches 22-1 to 22-4, respectively. Usually, the number of the channels of the processing systems provided to the receiver 9 is smaller than the number of the element coils which can be connected with the selector 8b. That is, when using the signal selecting circuit 81, the number of the channels of the processing systems provided to the receiver 9 is usually 15 or below. In this case, the processing systems whose numbers are close to each other are connected with the matrix channels 22-1 to 22-4, respectively. For example, when the receiver 9 has eight channel processing systems, two channel processing systems are connected with each of the matrix switches 22-1 to 22-4. It is to be noted that achieving connection so that output signals having continuous numbers can be input to the receiver 9 enables attaining connection in the above-explained state in this embodiment. Specifically, when connection is achieved so that the output signals OUT1 to OUT8 can be input the eight channel processing systems of the receiver 9, connection in the above-explained state can be attained. When connection is formed so that the output signals OUT5 to OUT12 or the output signals OUT7 to OUT14 are input to the eight channel processing systems of the receiver 9, connection can be likewise attained in the above-explained state.

Meanwhile, the driver 23 drives the matrix switches 21-1 to 21-4 so that close number of selected input signals can be input to each of the matrix switches 22-1 to 22-4. Further, the driver 23 drives the matrix switches 22-1 to 22-4 so that signals input from the matrix switches 21-1 to 21-4 can be output from the output terminals connected with the processing systems of the receiver 9. Specifically, when eight input signals are selected, the driver 23 drives the matrix switches 21-1 to 21-4 so that two signals can be input to each of the matrix switches 22-1 to 22-4. Since two channel processing systems are connected with each of the matrix switches 22-1 to 22-4 in this manner, the driver 23 drives the matrix switches 22-1 to 22-4 so that input two signals are output to these connected processing systems. This can be realized by associating selected input signals with output signals input to the processing systems of the receiver 9 in an ascending order of numbers of these signals, for example.

Specifically, when the input signals IN1 to IN8 are selected and the output signals OUT1 to OUT8 are input to the processing systems of the receiver 9, the input signals IN1 to IN8 are associated with the output signals OUT1 to OUT8, respectively. Furthermore, the driver 23 controls the matrix switches 21-1, 21-2, and 22-1 to 22-4 to achieve the following connection states.

(1) The input signal IN1 is output as the output signal OUT1 through the matrix switch 21-1 and the matrix switch 22-1.
(2) The input signal IN2 is output as the output signal OUT2 through the matrix switch 21-1 and the matrix switch 22-2.
(3) The input signal IN3 is output as the output signal OUT3 through the matrix switch 21-1 and the matrix switch 22-3.
(4) The input signal IN4 is output as the output signal OUT4 through the matrix switch 21-1 and the matrix switch 22-4.
(5) The input signal IN5 is output as the output signal OUT5 through the matrix switch 21-2 and the matrix switch 22-1.
(6) The input signal IN5 is output as the output signal OUT6 through the matrix switch 21-1 and the matrix switch 22-2.
(7) The input signal IN7 is output as the output signal OUT7 through the matrix switch 21-2 and the matrix switch 22-3.
(8) The input signal IN8 is output as the output signal OUT8 through the matrix switch 21-2 and the matrix switch 22-4.

As explained above, since the eight routes are all independent, a desired selection state can be achieved.

That is, the output signal OUT1 and the output signal OUT5 are output from the same matrix switch 22-1, and this matrix switch 22-1 is connected with the matrix switch 21-1 through one signal line alone. Therefore, two of the input signals IN1 to IN4 of the matrix switch 21-1 cannot be output as the output signal OUT1 and the output signal OUT5. However, when the output signal OUT5 is enabled, five or more input signals are selected, and the output signal OUT5 is associated with any one of the input signals IN5 to IN16. Therefore, two of the input signals IN1 to IN4 of the matrix switch 21-1 are not associated with the output signal OUT1 and the output signal OUT5, and a desired selection status can be attained as explained above.

When any input signal is selected, or when any output signal is input to the processing system of the receiver 9, a desired selection status can be likewise achieved.

On the other hand, when applying the thus configured signal selecting circuit 81 to the selector 8a, up to 16 RF signals can be input to a total of 16 input terminals provided to the matrix switches 21-1 to 21-4. It is to be noted that, when the number of the RF signals output from a transmitter 7 is 15 or below, the input terminals to which these RF signals are to be input can be arbitrarily selected.

A plurality of element coils provided to an RF coil unit 6a or an RF coil unit 6b are connected with output terminals of the matrix switches 22-1 to 22-4, respectively. Usually, the number of the RF signals output from the transmitter 7 is smaller than the number of the element coils which can be connected with the selector 8a. That is, when using the signal selecting circuit 81, the number of the RF signals is usually 15 or below. In this case, sets of the RF signals whose numbers are as close to each other as possible are input to the matrix switches 21-1 to 21-1, respectively. For example, when the number of the RF signals is eight, two RF signals are input to each of the matrix switches 21-1 to 21-4, respectively.

Meanwhile, the driver 23 drives the matrix switches 21-1 to 21-4 so that sets of the RF signals whose numbers are as close as possible to each other are input to the respective switches 22-1 to 22-4, and also drives the matrix switches 22-1 to 22-4 so that the signals input from the matrix switches 21-1 to 21-4 can be output to the enabled element coils. It is to be noted that an element coil to be enabled is determined while considering a size of a diagnostic region, a direction of a slice, a sensitivity region of each element coil, a region where RF is excited, and others.

FIG. 3 is a view showing an example of a connection state of the RF coil unit 6b and the transmitter 7 with respect to the selector 8a. However, the signal selecting circuit 81 is used as the selector 8a.

In the example depicted in FIG. 3, the RF coil unit 6b includes 10 element coils 61-1 to 61-10. These element coils 61-1 to 61-10 are connected with the selector 8a so that the output signals OUT1 to OUT10 are respectively input.

The transmitter 7 includes a transmission amplifier 71, a splitter 72, and six phase shifters 73-1 to 73-6. The transmission amplifier 71 amplifies an RF pulse. The splitter 72 divides the RF pulse output from the transmission amplifier 71 into six, and provides them to the phase shifters 73-1 to 73-6, respectively. The phase shifters 73-1 to 73-6 individually change phases of the RF pulses. The phase shifters 73-1 to 73-6 are connected with the selector 8a so that their output signals serve as the input signals IN1 to IN6.

FIG. 4 is a view showing an example of a connection state of the RF coil unit 6d and the receiver 9 with respect to the selector 8b. However, it is determined that the signal selecting circuit 81 is used as the selector 8b.

In the example in FIG. 4, the receiver 9 includes eight receiving circuits 91-1 to 91-8. These receiving circuits 91-1 to 91-8 are connected with the selector 8b so that the output signals OUT1 to OUT5 are respectively input.

The RF coil unit 6d includes four coil sections 62-1 to 62-4 and four combiners 63-1 to 63-4.

Figure 5:
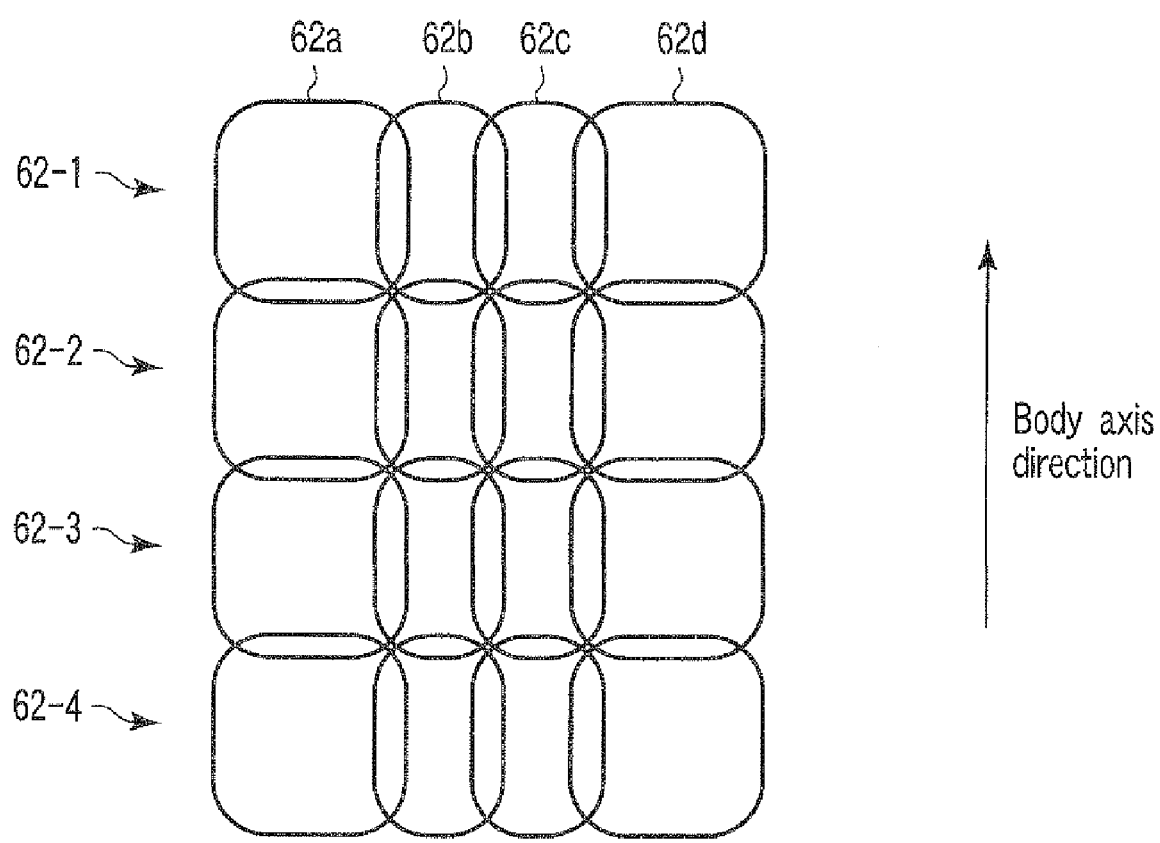
FIG. 5 is a view showing an example of an arrangement of coil sections and element coils in the RF coil unit in FIG. 1.

Each of the coil sections 62-1 to 62-4 includes four element coils 62a, 62b, 62c, and 62d. The element coils 62a, 62b, 62c, and 62d are linearly aligned so that coils adjacent to each other partially overlap each other. As shown in FIG. 5, the coil sections 61-1 to 62-4 are aligned to cross the alignment axis of the element coils 62a, 62b, 62c, and 62d. Neighboring ones of the coil sections 62-1 to 62-4 partially overlap each other.

This RF coil unit 6d is generally used in a state where the alignment axis of the element coils 62a, 62b, 62c, and 62d substantially matches the X-axis and the alignment axis of the coil sections 62-1 to 62-4 substantially matches the longitudinal axis of a top board 41, i.e., the body axis (Z-axis) of a subject P.

Each of the combiners 63-1 to 63-4 includes 180-degree distributing/combining circuits 63a and 63b and a 90-degree distributing/combining circuit 63c.

Signals output from the element coils 62a and 62d are input to the 180-degree distributing/combining circuit 63a. The 180-degree distributing/combining circuit 63a combines these signals in phase or antiphase. The 180-degree distributing/combining circuit 63a outputs a signal obtained as a result of combination in phase to the 90-degree distributing/combining circuit 63c. The 180-degree distributing/combining circuit 63a outputs a signal obtained as a result of combination in antiphase as an antiphase combined signal.

Signals output from the element coils 62b and 62c are respectively input to the 180-degree distributing/combining circuit 63b. The 180-degree distributing/combining circuit 63b combines these signal in phase and antiphase. The 180-degree distributing/combining circuit 63a outputs a signal obtained as a result of combination in phase as an in-phase combined signal. The 180-degree distributing/combining circuit 63a outputs a signal obtained as a result of combination in antiphase to the 90-degree distributing/combining circuit 63c.

The 90-degree distributing/combining circuit 63c shifts a phase of the signal supplied from the 180-degree distributing/combining circuit 63a 90 degrees, and combines this signal to the signal supplied from the 180-degree distributing/combining circuit 63b. The 90-degree distributing/combining circuit 63c outputs a signal obtained as a result of this combination as a QD signal. Moreover, the 90-degree distributing/combining circuit 63c outputs a signal which is in antiphase with the QD signal as an AntiQD signal.

The RF coil unit 6d is connected with the selector 8b in such a manner that the in-phase combined signal, the antiphase combined signal, the QD signal, and the AntiQD signal output from the combiner 63-1 serve as the input signals IN1 to IN4, the in-phase combined signal, the antiphase combined signal, the QD signal, and the AntiQD signal output from the combiner 63-2 serve as the input signals IN5 to IN8, the in-phase combined signal, the antiphase combined signal, the QD signal, and the AntiQD signal output from the combiner 63-3 serve as the input signals IN9 to IN12, and the in-phase combined signal, the antiphase combined signal, the QD signal, and the AntiQD signal output from the combiner 63-4 serve as the input signals IN13 to IN16.

Figure 6:
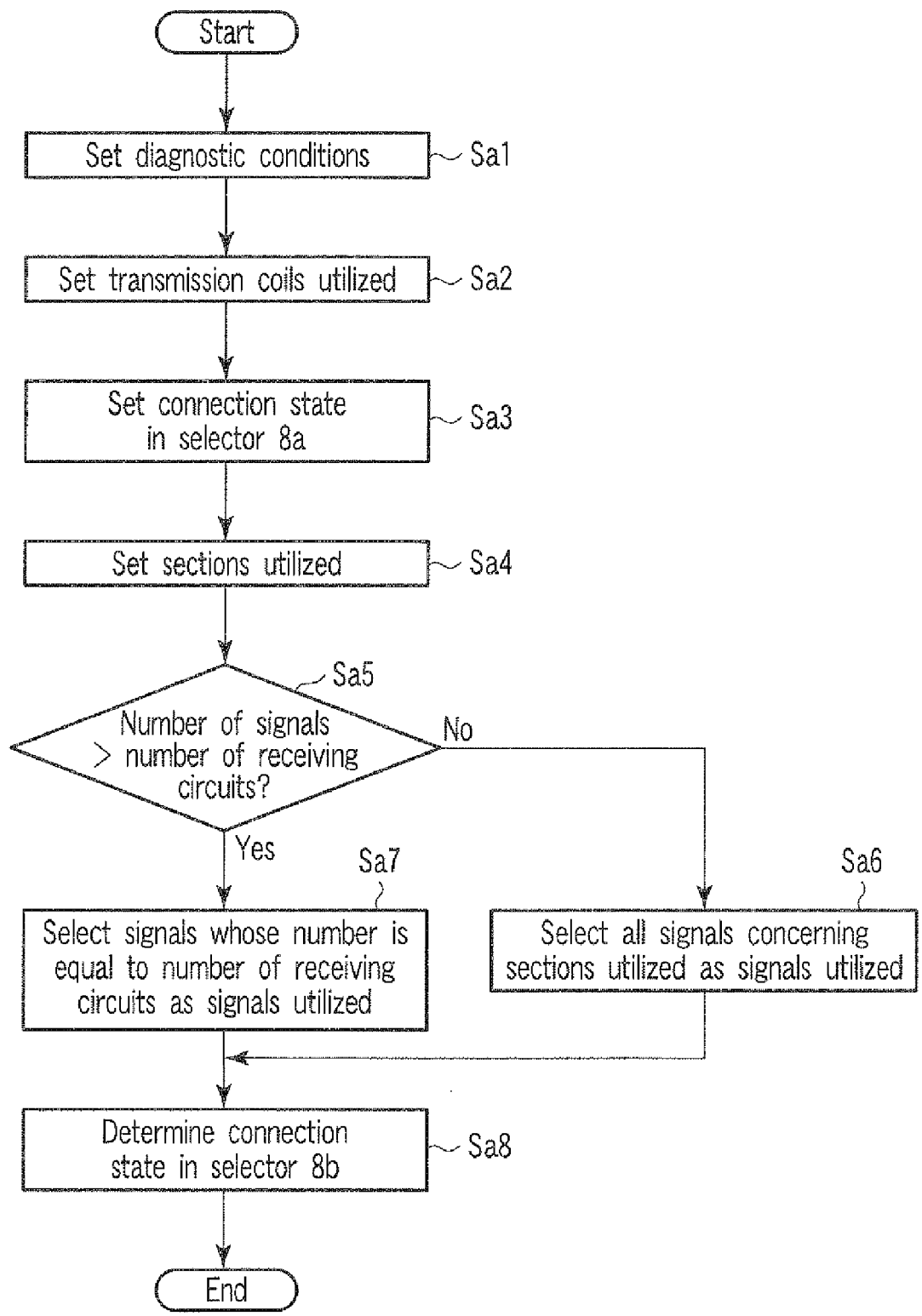
FIG. 6 is a flowchart showing a processing procedure of a main controller concerning control over the selectors in FIG. 1.

FIG. 6 is a flowchart showing a processing procedure of the main controller 17 concerning control over the selectors 8a and 8b.

In step Sa1, the main controller 17 sets diagnostic conditions in accordance with a command from an operator input at an input unit 16.

In step Sa2, the main controller 17 sets some of the element coils 61-1 to 61-10 as transmission coils utilized in accordance with the set diagnostic conditions. This setting is automatically carried out as well known while considering an FOV (field of view), a slice position, a size of a subject, and others in the set diagnostic conditions. It is to be noted that the size of the subject 200 can be calculated based on image data obtained by imaging the entire subject 200. The number of the transmission coils utilized is determined as the number of the phase shifter 73-1 to 73-6 or below. It is to be noted that selecting the minimum necessary number of element coils as the transmission coils utilized is preferable in order to reduce a magnetic resonance signal which becomes noise for image reconstruction, and the number of the transmission coils utilized is generally small.

In step Sa3, the main controller 17 determines a connection state in the selector 8a in such a manner that the RF signals output from the phase shifters, whose number is equal to that of the transmission coils utilized, in the phase shifters 73-1 to 73-6 are respectively input to the element coils selected as the transmission coils utilized. Further, the main controller 17 informs the selector 8a of this determined connection state.

Figure 7:
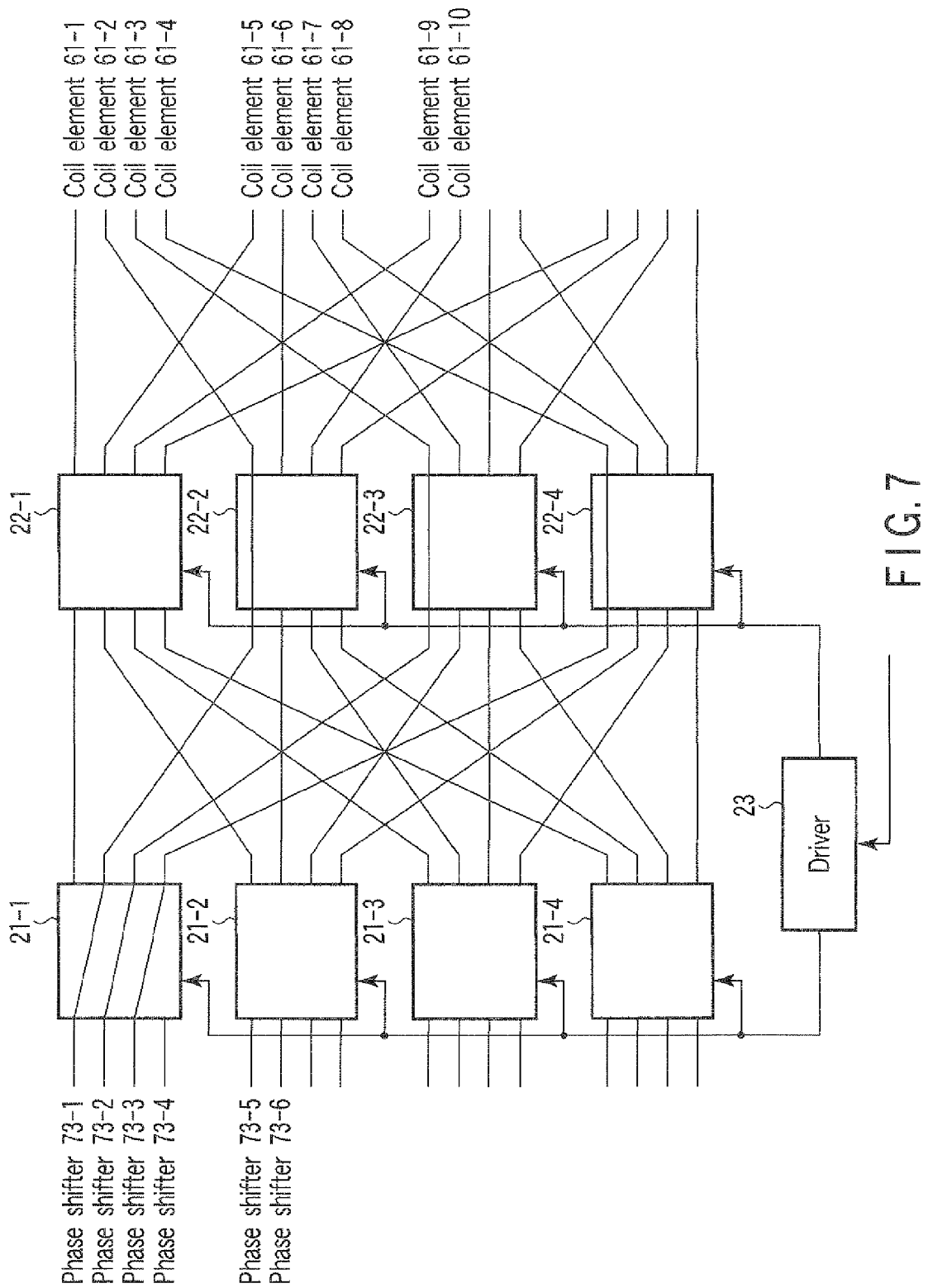
FIG. 7 is a view showing an example of a connection state in the selector.

FIG. 7 is a view showing an example of a connection state in the selector 8a when the element coils 61-2, 61-3, and 61-4 are set as the transmission coils utilized. The connection states are as follows.

(1) The RF pulse output from the phase shifter 73-1 is supplied to the element coil 61-1 through the matrix switch 21-1 and the matrix switch 22-2.

(2) The RF pulse output from the phase shifter 73-2 is supplied to the element coil 61-2 through the matrix switch 21-1 and the matrix switch 22-3.

(3) The RF pulse output from the phase shifter 73-3 is supplied to the element coil 61-1 through the matrix switch 21-1 and the matrix switch 22-3.

In step Sa4, the main controller 17 sets one or some of the coil sections 62-1 to 62-4 as sections utilized. This setting may be performed in accordance with a command from an operator input at the input unit 16 or may be automatically carried out in accordance with the diagnostic conditions set in the step Sa1.

Figures 8, 14:
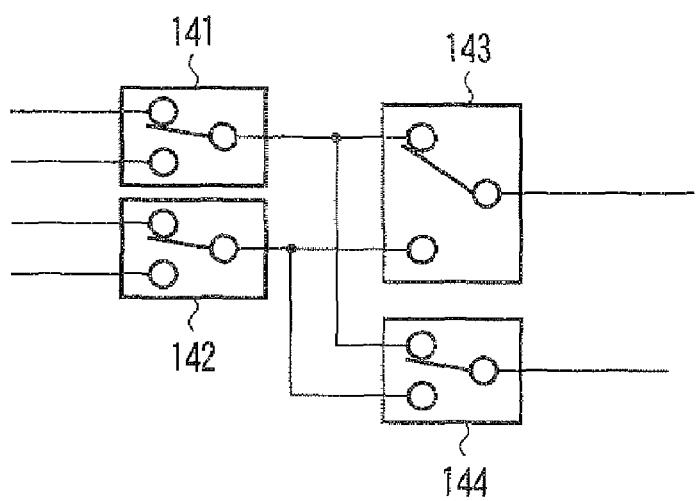
FIG. 8 is a view showing an example of section priorities.
FIG. 14 is a view showing a structural example of a transfer type switch.

In step Sa5, the main controller 17 confirms whether the number of signals obtained in relation to the sections utilized is larger than the number of the receiving circuits 91-1 to 91-8. If the number of signals is equal to or smaller than the number of the receiving circuits here, the main controller 17 advances to a step Sa6 from the step Sa5. In the step Sa6, the main controller 17 selects all signals concerning the sections utilized as signals utilized. However, when the number of signals is larger than the number of the receiving circuits, the main controller 17 advances to a step Sa7 from the step Sa5. In the step Sa7, the main controller 17 selects signals, whose number is equal to the number of the receiving circuits, from all the signals concerning the sections utilized as signals utilized. The signals utilized are selected based on, e.g., priorities determined in advance. For example, in case of parallel imaging, a priority sequence of the respective signals is the QD signal, the in-phase combined signal, the antiphase combined signal, and the AntiQD signal. Furthermore, when all of the same type of signals cannot be selected, a reference is made to section priorities determined as shown in FIG. 8.

Specifically, if the coil sections 62-1, 62-2, and 62-3 are set as the sections utilized, a total number of the QD signals and the in-phase combined signals concerning these coil sections is six. Therefore, all of these signals can be selected as the signals utilized. However, since the number of the receiving circuits is eight, all of the three antiphase combined signals cannot be selected as the signals utilized. Thus, based on the selection priorities shown in FIG. 8, the antiphase combined signals concerning the coil section 62-2 having a priority "1" and the coil section 63-1 having a priority "2" are selected as the signals utilized.

Upon completing selection of the signals utilized in the step Sa6 or the step Sa7, the main controller 17 advances to a step Sa8. In the step Sa8, the main controller 17 determines a connection state in the selector 8b in such a manner that the respective signals selected as the signals utilized are input to the receiving circuits whose number is equal to the number of these signals. Furthermore, the main controller 17 informs the selector 8b of this determined connection state.

Figure 9:
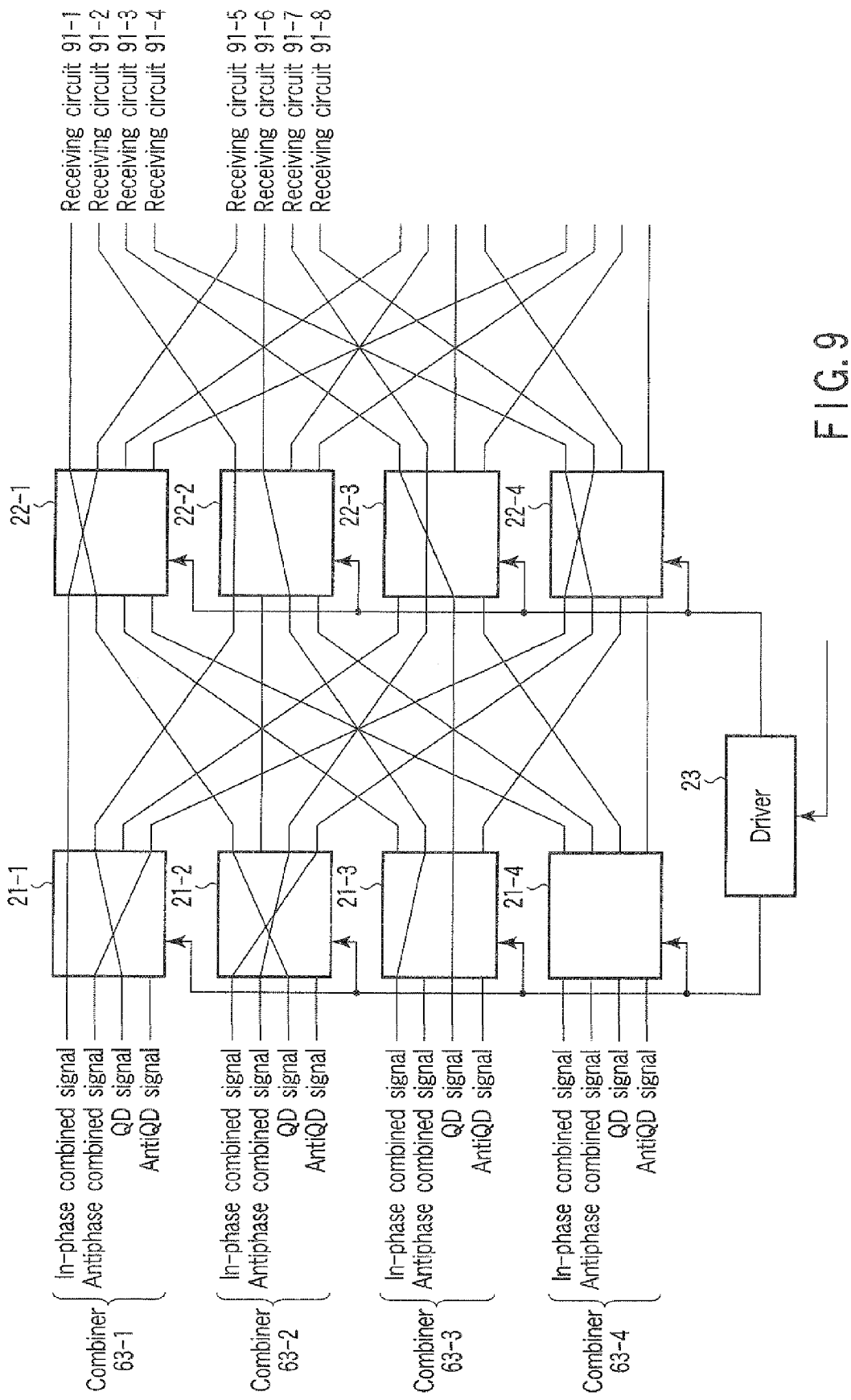
FIG. 9 is a view showing an example of a connection state in the selector.

FIG. 9 is a view showing an example of a connection state in the selector 8b in the above specific example. The connection state is as follows.

(1) The QD signal output from the combiner 63-2 is input to the receiving circuit 91-1 through the matrix switch 21-2 and the matrix switch 22-1.
(2) The QD signal output from the combiner 63-1 is input to the receiving circuit 91-2 through the matrix switch 21-1 and the matrix switch 22-2.
(3) The QD signal output from the combiner 63-3 is input to the receiving circuit 91-3 through the matrix switch 21-3 and the matrix switch 22-3.
(4) The in-phase combined signal output from the combiner 63-2 is input to the receiving circuit 91-4 through the matrix switch 21-2 and the matrix switch 22-4.
(5) The in-phase combined signal output from the combiner 63-1 is input to the receiving circuit 91-5 through the matrix switch 21-1 and the matrix switch 22-2.
(6) The in-phase combined signal output from the combiner 63-3 is input to the receiving circuit 91-6 through the matrix switch 21-3 and the matrix switch 22-2.
(7) The antiphase combined signal output from the combiner 63-2 is input to the receiving circuit 91-7 through the matrix switch 21-2 and the matrix switch 22-3.
(8) The antiphase combined signal output from the combiner 63-1 is input to the receiving circuit 91-8 through the matrix switch 21-1 and the matrix switch 22-4.

As explained above, according to the signal selecting circuit 81, arbitrary signals can be selected from the 16 input signals IN1 to IN16 and output as output signals which are input to the processing systems of the receiver 9. Furthermore, although this signal selecting circuit 81 has a 16×16 structure, all of the matrix switches 21-1 to 21-4 and 22-1 to 22-4 may have a 4×4 structure. As a result, a stab can be reduced as compared with a 16×16 matrix switch, and a radio-frequency magnetic resonance signal can be excellently transmitted, or an RF signal can be transmitted while suppressing unnecessary radiation.

SECOND EMBODIMENT

FIG. 10 is a view showing a structure of a signal selecting circuit 82 according to a second embodiment which can be utilized as a selector 8a or a selector 8b. Both a maximum number of input signals and a maximum number of output signals of this signal selecting circuit 82 are "32".

The signal selecting circuit 82 includes matrix switches 24-1 to 24-4, matrix switches 25-1 to 25-4, and a driver 26.

Each of the matrix switches 24-1 to 24-1 and the matrix switches 25-1 to 25-4 is a matrix switch having a known 8×8 structure.

Signals output from respective element coils provided in the RE coil units 6c and 6d are input to a total of 32 input terminals provided to the matrix switches 24-1 to 24-4. It is to be noted that signals input to the matrix switch 24-1 are referred to as input signals IN1 to IN8, signals input to the matrix switch 24-1 are referred to as IN9 to IN16, signals input to the matrix switch 24-3 are referred to as IN17 to IN24, and signals input to the matrix switch 24-4 are referred to as IN25 to IN32.

In regard to eight output terminals of each of the matrix switches 24-1 to 24-4, every two output terminals are connected with input terminals provided to each of the matrix switches 25-1 to 25-4. Signals output from first and second output terminals respectively provided to the matrix switches 25-1 to 25-4 are output from the signal selecting circuit 82 as output signals OUT1 to OUT8. Signals output from third and fourth output terminals respectively provided to the matrix switches 25-1 to 25-4 are output from the signal selecting circuit 82 as output signals OUT9 to OUT16. Signals output from fifth and sixth output terminals respectively provided to the matrix switches 25-1 to 25-4 are output from the signal selecting circuit 82 as OUT17 to OU24. Signals output from seventh and eighth output terminals respectively provided to the matrix switches 25-1 to 25-4 are output from the signal selecting circuit 82 as output signals OUT25 to OUT32.

The driver 26 receives a command from a main controller 17 through an interface unit 11. The driver 26 drives the matrix switches 24-1 to 24-4 and the matrix switches 25-1 to 25-4 so that appropriate signals can be selected in accordance with this command.

In the signal selecting circuit 82 having such a structure, when the driver 26 drives the matrix switches 24-1 to 24-4 and the matrix switches 25-1 to 25-4 under the same conditions as those in the first embodiment based on the same rule as that in the first embodiment, arbitrary signals can be likewise selected from the 32 input signals IN1 to IN32 and output as output signals which are input to processing systems of a receiver 9. Moreover, although this signal selecting circuit 82 has a 32×32 structure, each of the matrix switches 24-1 to 24-4 and 25-1 to 25-4 can have an 8×8 structure. As a result, a stab can be reduced as compared with the matrix switch having a 32×32 structure, and a radio-frequency magnetic resonance signal can be excellently transmitted, or an RF signal can be transmitted while suppressing unnecessary radiation.

THIRD EMBODIMENT

Figure 11:
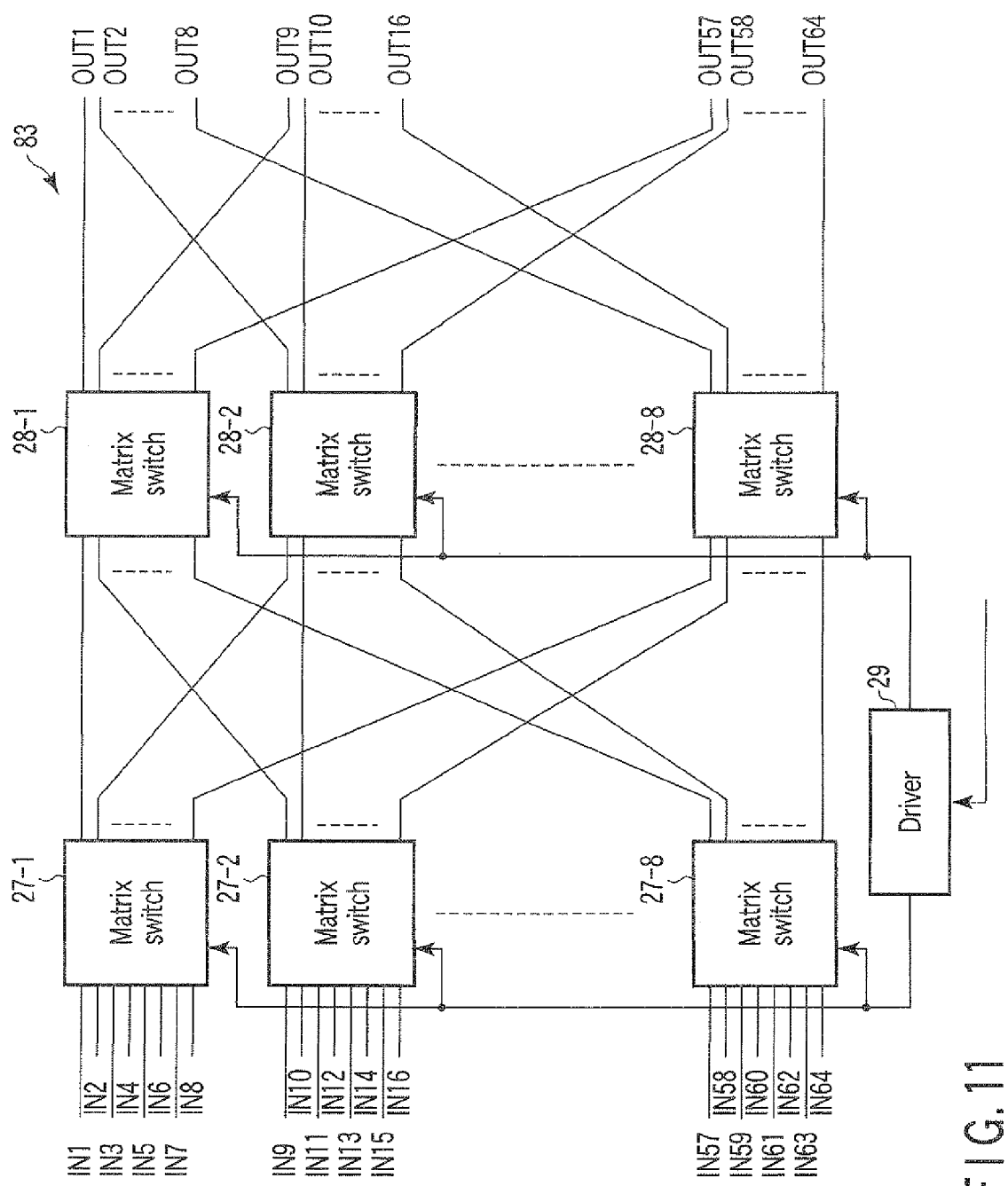
FIG. 11 is a view showing a structure of a signal selecting circuit according to a third embodiment which can be utilized as the selectors in FIG. 1.

FIG. 11 is a view showing a structure of a signal selecting circuit 83 according to a third embodiment which can be utilized as a selector 8a or a selector 8b. Both a maximum number of input signals and a maximum number of output signals of this signal selecting circuit 83 are "64".

The signal selecting circuit 83 includes matrix switches 27-1 to 27-8, matrix switches 28-1 to 28-8, and a driver 29.

Each of the matrix switches 27-1 to 27-8 and the matrix switches 28-1 to 28-B is a matrix switch having a known 8×8 structure.

Signals IN1 to IN64 output from element coils provided to RF coil units 6c and 6d are input to a total of 64 input terminals provided to the matrix switches 27-1 to 27-8, respectively.

Eight output terminals of each of the matrix switches 27-1 to 27-8 are connected with input terminals provided to each of the matrix switches 28-1 to 28-8, respectively. Signals output from first output terminals provided to the matrix switches 28-1 to 28-8 are output from the signal selecting circuit 83 as output signals OUT1 to OUT8, respectively. Signals output from second output terminals provided to the matrix switches 28-1 to 28-8 are output from the signal selecting circuit 83 as output signals OUT9 to OUT16, respectively. Likewise, signals output from third to eighth output terminals provided to the matrix switches 28-1 to 28-8 are output from the signal selecting circuit 83 as output signals OUT17 to OUT24, output signals OUT25 to OUT32, output signals OUT33 to OUT40, output signals OUT41 to OUT48, output signals OUT49 to OUT56, and output signals OUT57 to OUT64, respectively.

The driver 29 receives a command from a main controller 17 through an interface unit 11. The driver 29 drives the matrix switches 27-1 to 27-8 and the matrix switches 28-1 to 28-8 so that appropriate signals can be selected in accordance with this command.

Even in the signal selecting circuit 83 having such a structure, when the driver 29 drives the matrix switches 27-1 to 27-8 and the matrix switches 28-1 to 28-8 under the same conditions as those in the first embodiment based on the same rule as that in the first embodiment, arbitrary signals can be selected from the 64 input signals IN1 to IN64 and output as output signals which are input to processing systems of a receiver 9. Additionally, although this signal selecting circuit 83 has a 64×64 structure, each of the matrix switches 27-1 to 27-8 and 28-1 to 28-8 can have an 8×8 structure. As a result, a stab can be reduced as compared with a matrix switch having a 64×64 structure, and a radio-frequency magnetic resonance signal can be excellently transmitted, or an RF signal can be transmitted while suppressing unnecessary radiation.

FOURTH EMBODIMENT

Figure 12:
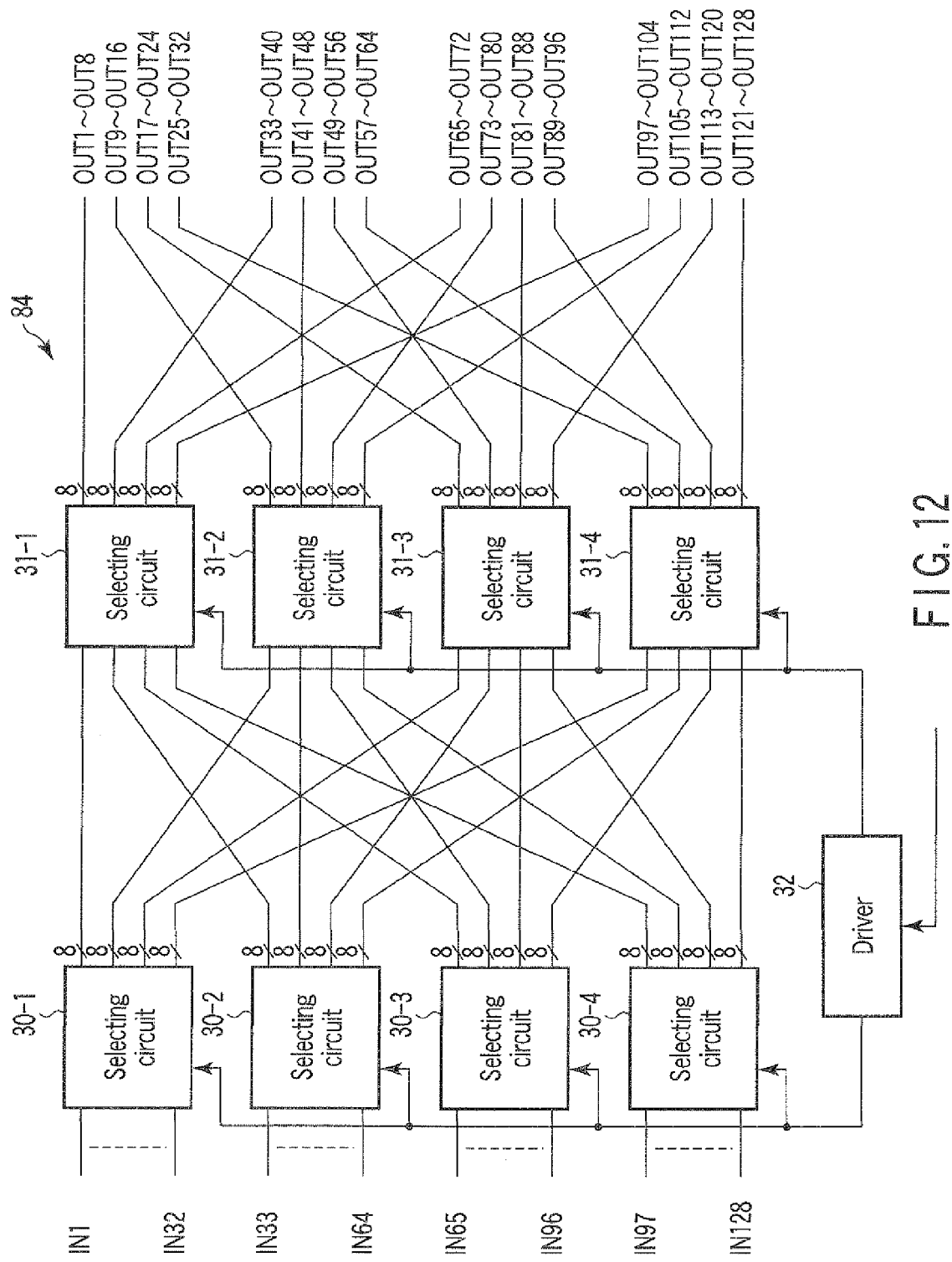
FIG. 12 is a view showing a structure of a signal selecting circuit according to a fourth embodiment which can be utilized as the selectors in FIG. 1.
Figure 15:
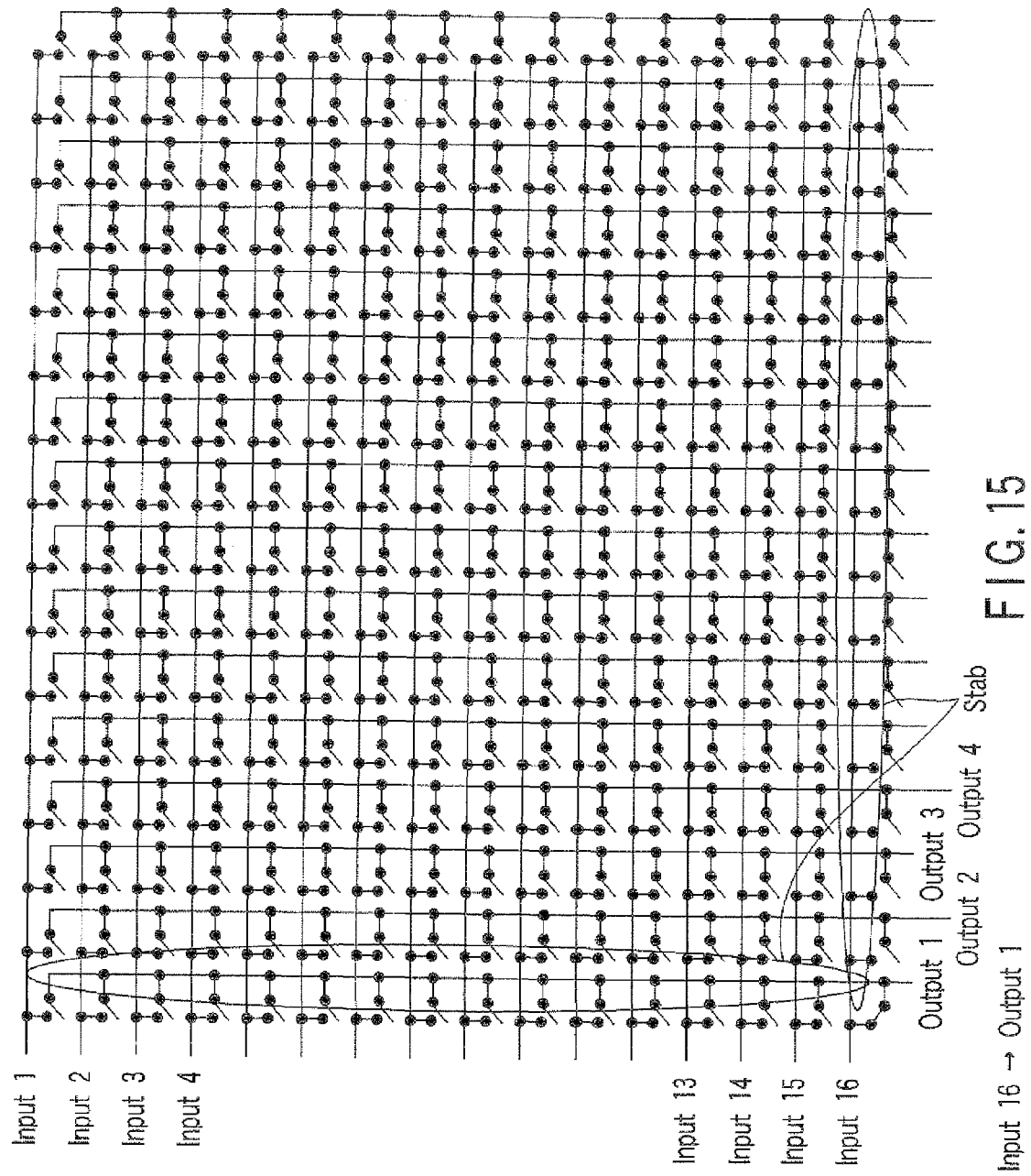
FIG. 15 is a view showing a structure of a 16-input/16-output matrix switch.

FIG. 12 is a view showing a structure of a signal selecting circuit 84 according to a fourth embodiment which can be utilized as a selector 8a or a selector 8b. Both a maximum number of input signals and a maximum number of output signals of this signal selecting circuit 84 are "128".

The signal selecting circuit 84 includes selecting circuits 30-1 to 30-4, selecting circuits 31-1 to 31-4, and a driver 32.

As each of the selecting circuits 30-1 to 30-4 and the selecting circuits 31-1 to 31-4, the signal selecting circuit 82 according to the second embodiment is used.

Signals IN1 to IN128 output from element coils provided to RF coil units 6c and 6d are input to a total of 128 input terminals provided to the selecting circuits 30-1 to 30-4, respectively.

In regard to 32 output terminals of each of the selecting circuits 30-1 to 30-4, every eight output terminals are connected with each input terminal provided to the selecting circuits 31-1 to 31-4. Signals output from first to eighth output terminals provided to the selecting circuits 31-1 to 31-4 are output from the signal selecting circuit 84 as output signals OUT1 to OUT32, respectively. Signals output from ninth to 16th output terminals provided to the selecting circuits 31-1 to 31-4 are output from the signal selecting circuit 84 as output signals OUT33 to OUT64, respectively. Signals output from 17th to 24th output terminals provided to the selecting circuits 31-1 to 31-4 are output from the signal selecting circuit 84 as output signals OUT65 to OUT96, respectively. Signals output from 24th to 32nd output terminals provided to the selecting circuits 31-1 to 31-4 are output from the signal selecting circuit 84 as output signals OUT97 to OUT128, respectively.

The driver 32 receives a command from a main controller 17 through an interface unit 11. The driver 32 drives the selecting circuits 30-1 to 30-4 and the selecting circuits 31-1 to 31-4 so that appropriate signals can be selected in accordance with this command.

Even in the signal selecting circuit 84 having such a structure, when the driver 32 drives the selecting circuits 30-1 to 30-4 and the selecting circuits 31-1 to 31-4 under the same conditions as those in the first embodiment based on the same rule as that in the first embodiment, arbitrary signals can be selected from the 128 input signals IN1 to IN128 and output as output signals which are input to processing systems of a receiver 9. Further, although this signal selecting circuit 84 has a 128×128 structure, each of the matrix switches provided to the selecting circuits 30-1 to 30-4 and 31-1 to 31-4 can have an 8×8 structure. As a result, a stab can be reduced as compared with a matrix switch having a 128×128 structure, and a radio-frequency magnetic resonance signal can be excellently transmitted, or an RF signal can be transmitted while suppressing unnecessary radiation.

This embodiment can be modified in many ways as follows.

The number of the matrix switches on each of the front stage side and the rear stage side, the number of inputs and the number of outputs of each matrix switch on the front stage side, and the number of inputs and the number of outputs of each matrix switch on the rear stage side can be arbitrarily set as long as conditions of the present invention are satisfied. It is to be noted that each of the above-explained values can be set with a necessary maximum number of output signals being determined as a reference in the signal selecting circuit used as the selector 8a, and each of the above-explained numbers can be set with a necessary maximum number of input signals being determined as a reference in the signal selecting circuit used as the selector 8b.

As shown in FIG. 13, both matrix switches 33-1 and 33-3 and a matrix switch 33-2 of different scales may be present as matrix switches on a front stage side. Likewise, a matrix switch of a different scale may be present as a matrix switch on a rear stages side. Furthermore, as shown in FIG. 13, the scales of the matrix switches 33-1 to 33-3 on the front stages side may be different from the scale of the matrix switches 34-1 and 34-2 on the rear stage side.

In each matrix switch on the rear stage side, the number of outputs may be smaller than the number of inputs. For example, in case of the first embodiment, each of the matrix switches 22-1 to 22-4 may be substituted by a matrix switch having a 4×2 structure. Such a configuration is useful in the signal selecting circuit utilized as the selector 8b.

In each matrix switch on the front stage side, the number of inputs may be smaller than the number of outputs. For example, in case of the first embodiment, each of the matrix switches 21-1 to 21-4 may be substituted by a matrix switch having a 2×4 matrix switch. Such a configuration is useful in the signal selecting circuit utilized as the selector 8a.

It is possible to substitute r matrix switches on the rear stage side by one matrix switch having r-fold inputs. For example, in case of the first embodiment, the matrix switches 22-1 to 22-2 can be substituted by one matrix switch having an 8×8 structure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
a applying unit which applies a gradient magnetic field and a radio-frequency pulse to a subject placed in a static magnetic field;
a radio-frequency coil unit which includes a plurality of element coils to respectively detect magnetic resonance signals emitted from the subject in accordance with the application of the gradient magnetic field and the radio-frequency pulse, and outputs signals of a plurality of channels based on the plurality of magnetic resonance signals detected by the plurality of element coils;
a plurality of receiving circuits each of which receives one of the signals of the plurality of channels, and whose number is smaller than the plurality of channels;
a selecting circuit which includes a plurality of matrix switches connected in multiple stages, selects some of magnetic resonance signals from the signals of the plurality of channels, and inputs the selected magnetic resonance signals to the plurality of receiving circuits;

a setting unit which sets diagnostic conditions; and a determining unit which determines a connection state of the plurality of matrix switches in accordance with the set diagnostic conditions.

2. The magnetic resonance imaging apparatus according to claim 1, wherein the radio-frequency coil has a structure where the plurality of element coils are arranged in two directions perpendicular to each other, the setting unit sets element coils to be used from among the plurality of element coils, as the diagnostic conditions, and the determining unit determines the connection state in accordance with the element coils to be used.

3. The magnetic resonance imaging apparatus according to claim 1, wherein the radio-frequency coil has a structure where the plurality of element coils are arranged in two directions perpendicular to each other, the setting unit sets priority utilization conditions of the plurality of element coils as the diagnostic conditions, and the determining unit determines the connection state in accordance with the priority utilization conditions.

4. The magnetic resonance imaging apparatus according to claim 1, wherein the selecting circuit includes matrix switch groups on a first stage and a second stages each of the matrix switch groups including a plurality of matrix switches each having m input terminals and n output terminals;

the input terminals of the plurality of matrix switches included in the matrix switch group on the first stage respectively connected with the plurality of element coils and the output terminals of the plurality of matrix switches included in the matrix switch group on the second stage respectively connected with input terminals of the matrix switches included in the matrix switch group on the second stage, and some of output terminals of the plurality of matrix switches included in the matrix switch group on the second stage are respectively connected with the plurality of receiving circuits.

5. A magnetic resonance imaging apparatus comprising:

a transmission coil having a plurality of element coils;

transmitting circuits which transmit a radio-frequency pulse applied to a subject placed in a static magnetic field through the element coils, and whose number is smaller than the plurality of element coils;

a selecting circuit which includes a plurality of matrix switches connected in multiple stages, selects some of the plurality of element coils, and connects the selected element coils with the plurality of transmitters;

a determining unit determines a connection state of the plurality of matrix switches in accordance with a size of the subject; and a receiving coil which detects an electromagnetic field emitted from the subject in accordance with the application of a radio-frequency magnetic field produced form the element coils in a state where a gradient magnetic field is applied in accordance with the radio-frequency pulse input based on the connection state.

6. The magnetic resonance imaging apparatus according to claim 5, further comprising a setting unit which sets at least one of an FOV (field of view), a slice position, and a size of the subject, wherein the determining unit determines the connection state in accordance with a setting result obtained by the setting unit.

7. The magnetic resonance imaging apparatus according to claim 5, further comprising a calculating unit which calculates a size of the subject based on image data concerning the subject, wherein the determining means determines the connection state based on the size of the subject calculated by the calculating unit.

8. A magnetic resonance method for use in a magnetic resonance imaging apparatus comprising:

a high-frequency coil unit including a plurality of element coils; and a selecting circuit which includes a plurality of matrix switches connected in multiple stages, said method comprising:

setting an imaging condition;

determining a connection state of the matrix switches in accordance with the set imaging condition;

applying a gradient magnetic field and a radio-frequency pulse to a subject placed in a static magnetic field;

detecting magnetic resonance signals emitted from the subject in accordance with the application of the gradient magnetic field and the radio-frequency pulse, at each of the element coils;

acquiring signals of a plurality of channels based on the magnetic resonance signals detected by the element coils;

selecting part of the signals of the plurality of channels by means of the selecting circuit whose connection state of the matrix switches is the determined connection state; and receiving and processing signals selected by the selecting circuit.

9. A magnetic resonance imaging method for use in a magnetic resonance imaging apparatus comprising:

a transmission coil having a plurality of element coils; and a selection circuit including a plurality of matrix switches connected in multiple stages, said method comprising:

determining a connection state of the matrix switches in accordance with size of a subject;

selecting part of the element coils by means of the selecting circuit whose connection state of the matrix switches is the determined connection state;

transmitting radio-frequency pulses to be applied to the subject placed in a static magnetic field through the element coils, by supplying selected ones of the element coils with radio-frequency pulses which are smaller in number than the element coils; and detecting an electromagnetic field emitted from the subject in accordance with the application of a radio-frequency magnetic field produced form the selected ones of the element coils in a state where a gradient magnetic field is applied.

* * * * *